(12) United States Patent
Buller et al.

(10) Patent No.: US 7,800,075 B2
(45) Date of Patent: Sep. 21, 2010

(54) MULTI-FUNCTION MODULE FOR AN ELECTRON BEAM COLUMN

(76) Inventors: Benyamin Buller, 10379 Lansdale Ave., Cupertino, CA (US) 95014; William J. DeVore, 22828 Kings Ct., Hayward, CA (US) 94541; Juergen Frosien, Kufsteinerstrasse 16A, Riemerling, D-85521 (DE); Xinrong Jiang, 3264 Greer Rd., Palo Alto, CA (US) 94303; Richard L. Lozes, P.O. Box 5340, Pleasanton, CA (US) 94566; Henry Thomas Pearce-Percy, 23415 Skyview Ter., Los Gatos, CA (US) 95033; Dieter Winkler, Stademannstr. 6, Munich, D-81737 (DE); Steven T. Coyle, 1049 Fair Oaks Ave., Alameda, CA (US) 94501; Helmut Banzhof, Margeritenser. 12c, 85596 Poing (DE)

( * ) Notice: Subject to any disclaimer, the term of this patent is extended or adjusted under 35 U.S.C. 154(b) by 160 days.

(21) Appl. No.: 12/194,220

(22) Filed: Aug. 19, 2008

(65) Prior Publication Data

US 2008/0308751 A1    Dec. 18, 2008

Related U.S. Application Data

(62) Division of application No. 11/243,363, filed on Oct. 3, 2005, now Pat. No. 7,427,765.

(51) Int. Cl.
G21K 1/08 (2006.01)
H01J 3/14 (2006.01)
H01J 3/26 (2006.01)
H01J 49/42 (2006.01)

(52) U.S. Cl. .............................. 250/396 R; 250/492.22; 250/492.23; 250/492.24; 250/492.2; 250/492.21; 250/398; 250/396; 250/210; 250/310; 250/423; 313/542; 313/530; 313/531; 313/541; 313/544; 313/311; 313/346; 313/351; 313/309

(58) Field of Classification Search ............ 250/492.22, 250/492.23, 492.24, 492.2, 492.21, 398, 250/396, 210, 310, 423; 313/542, 530, 531, 313/539, 541, 544, 311, 346, 351, 309
See application file for complete search history.

(56) References Cited

U.S. PATENT DOCUMENTS 3,894,271 A    7/1975    Pfeiffer et al.

(Continued)

FOREIGN PATENT DOCUMENTS

EP    1296351 A1    3/2003

(Continued)

OTHER PUBLICATIONS

H.C. Pfeifer, "Variable spot shaping for electron-beam lithography," J. Vac. Sci Technology, 15(3), May/Jun. 1978, pp. 887-890, IBM.

(Continued)

*Primary Examiner*—Jack I Berman
*Assistant Examiner*—Meenakshi S Sahu
(74) *Attorney, Agent, or Firm*—Ashok K. Janah; Janah & Associates P.C.

(57) ABSTRACT

A multifunction module for an electron beam column comprises upper and lower electrodes, and a central ring electrode. The upper and lower electrodes have multipoles and are capable of deflecting, or correcting an aberration of, an electron beam passing through the electrodes. A voltage can be applied to the central ring electrode independently of the voltages applied to the upper and lower electrodes to focus the electron beam on a substrate.

12 Claims, 8 Drawing Sheets

U.S. PATENT DOCUMENTS

| | | | |
|---|---|---|---|
| 4,243,866 A | 1/1981 | Pfeiffer et al. | |
| 4,525,629 A | 6/1985 | Morita et al. | |
| 4,544,845 A | 10/1985 | Michel | |
| 4,639,597 A | 1/1987 | Shiokawa | |
| 4,962,306 A | 10/1990 | Hodgson | |
| 4,963,748 A | 10/1990 | Szilagyi | |
| 5,585,691 A | 12/1996 | Washburn | |
| 5,674,413 A | 10/1997 | Pfeiffer et al. | |
| 5,876,902 A | 3/1999 | Veneklasen et al. | |
| 6,168,832 B1 | 1/2001 | Boucher | |
| 6,259,106 B1 | 7/2001 | Boegli et al. | |
| 6,262,429 B1 | 7/2001 | Rishton et al. | |
| 6,376,842 B1 | 4/2002 | Yamada | |
| 6,488,825 B1 | 12/2002 | Hilliard | |
| 6,525,328 B1 | 2/2003 | Miyoshi et al. | |
| 6,621,090 B2 | 9/2003 | Simizu | |
| 6,724,002 B2 | 4/2004 | Mankos et al. | |
| 6,753,540 B2 | 6/2004 | Wakimoto | |
| 6,798,126 B2 | 9/2004 | Schwind et al. | |
| 6,828,574 B1 | 12/2004 | Allen | |
| 7,095,037 B2 | 8/2006 | Fernadez et al. | |
| 7,244,953 B2 * | 7/2007 | Buller et al. | 250/492.22 |
| 7,297,949 B2 | 11/2007 | Nakasuji et al. | |
| 7,427,765 B2 * | 9/2008 | Buller et al. | 250/492.23 |
| 7,476,880 B2 * | 1/2009 | Buller et al. | 250/492.22 |
| 2002/0033449 A1 | 3/2002 | Nakasuji et al. | |
| 2002/0153494 A1 | 10/2002 | Simizu | |
| 2003/0042434 A1 | 3/2003 | Mankos et al. | |
| 2003/0048427 A1 | 3/2003 | Fernandez et al. | |
| 2004/0032659 A1 | 2/2004 | Drinkwater | |
| 2004/0119023 A1 | 6/2004 | Nakasuji et al. | |
| 2004/0232357 A1 | 11/2004 | Fernadez et al. | |
| 2007/0057186 A1 | 3/2007 | Nakasuji et al. | |
| 2007/0187621 A1 | 8/2007 | Ward et al. | |

FOREIGN PATENT DOCUMENTS

| | | |
|---|---|---|
| EP | 1804091 A2 | 7/2007 |
| WO | WO 0206858 A2 | 1/2002 |
| WO | WO 0213226 A2 | 3/2002 |
| WO | WO 2007067313 A2 | 6/2007 |

OTHER PUBLICATIONS

Y. Sodha et al., "Recent progress in cell-projection electron-beam lithography," Microelectronic Engineering, 67-68, 2003, pp. 78-86, Hitachi.

K. Nakamura et al., "Advanced electron beam lithography system for sub-half-micron ultra-large-scale production..," JVST B8, (6), Nov./Dec. 1990, pp. 1903-1908, JEOL Ltd.

M. Fujinami et al., "EB60: An advanced direct wafer exposure electron-beam lithography system..," J. Vac. Sci. Technology, B5 (1), 1987, pp. 61-65.

T. Watanabe et al., "Reliability enhancements for the direct wafer exposure electron beam system EB60," J. Vac. Sci. Technology, B9 (6),1991, pp. 3028-3032.

T. Hosokawa et al., "Electron beam optical system with large field coverage for submicron lithography," J. Vac. Sci Technology, B1 (4), 1983, pp. 1293-1297.

Nakagawa et al., "Development of a Next Generation E-Beam Lithography System," SPIE 3546, 1998, pp. 45-54.

Komagata et al., "Development of electron beam optical column for mask lithography system," SPIE 3096, 1997, pp. 125-136.

Nakagawa et al., "Development of a Next Generation," JEOL Ltd., Semiconductor Equipment Division, Tokyo, Japan, Sep. 1998.

Dick et al., "Parallel and Hierarchial Post Processing . . . ," J. Vac. Science Technology, B 16(6), Nov./Dec. 1998.

Takemura et al., "Advanced E-Beam Lithography System..," 19th Annual, BACUS Symposium on Photomask Technology, Monterey, California, Sep. 1999, SPIE, Vol. 3873,pp. 277-786.

Ph.D. Thesis of David William Tuggle, "Emission Characteristics and Electron Optical Properties of the ZrO/W Point Cathode," Jun. 1984, Oregon Graduate Center.

Katsap, Va., Sewell, P.B., Kwaskiewicz, W.K., and Zhu, W., A uniform, large-area thermionic cathode as a high emittance electron source for the SCALPEL tool,: Lucent Technologies, Bell Lab, Murray Hill, NJ., Vacuum Electronics Conference, 2000, Abstracts, pp. 2- . . . . .

Szilagyi, Miklos, "Electron and Ion Optics," Plenum Press, New York, 1988, Chapter 10, pp. 475-476.

* cited by examiner

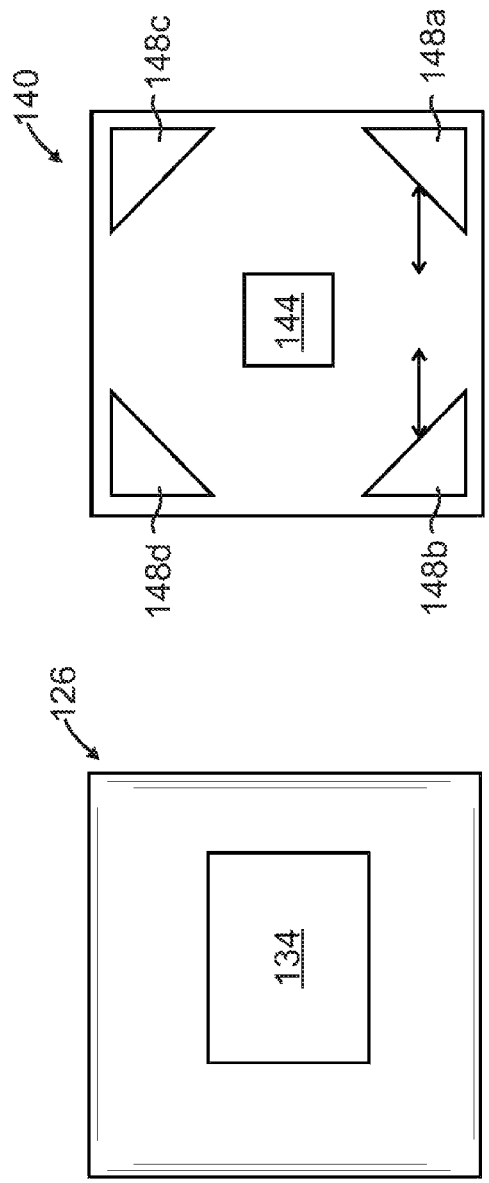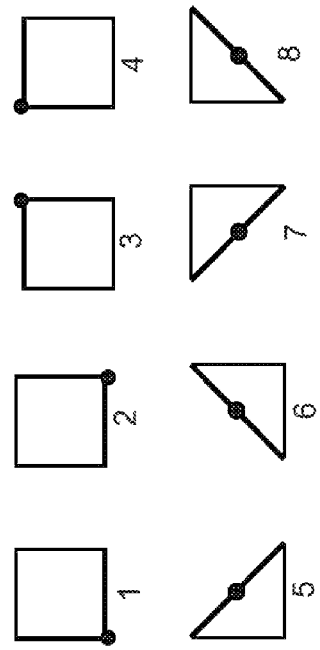

MULTI-FUNCTION MODULE FOR AN ELECTRON BEAM COLUMN

CROSS-REFERENCE

This application is a Divisional of U.S. patent application Ser. No. 11/243,363, which was filed on Oct. 3, 2005, now U.S. Pat. No. 7,427,765 to Buller et al. and which is incorporated by reference herein in its entirety.

BACKGROUND

Embodiments of the present invention relate to a multi-function module for an electron beam column.

Pattern generators are used to write patterns on substrates, such as masks for semiconductor fabrication, semiconductor wafers, displays and circuit boards, magnetic bubble fabrication, and optical data storage media fabrication. Patterned lithographic masks are used to transfer a circuit design pattern into a substrate, such as a semiconductor wafer or dielectric to fabricate integrated circuits, printed circuits (PCB), displays, and other patterned boards. A typical process for fabricating a lithographic mask includes, for example, (i) forming a layer of a metal-containing material on a radiation permeable plate, (ii) forming a resist layer on the metal-containing layer to create a blank lithographic mask, the resist layer being sensitive to a charged electron beam such as an electron or ion beam, (iii) writing a pattern on the mask by selectively exposing the blank lithographic mask to the modulated electron beam, (iv) developing the exposed material to reveal a pattern of features, (v) etching the revealed portions of the metal-containing material between the resist features to transfer the pattern captured in the resist features into the metal-containing material, and (vi) stripping residual resist from the lithographic mask.

In electron beam pattern generation, the circuit design pattern is written by selectively exposing an electron sensitive resist on the substrate to a modulated electron beam. The electron beam is formed in a beam column having discrete components that generate, focus, blank and deflect the electrons to write a pattern on a substrate. Conventional electron beam columns are for example described in U.S. Pat. No. 6,262,429 to Rishton et al.; U.S. Pat. No. 5,876,902 to Veneklasen et al.; U.S. Pat. No. 3,900,737 to Collier et al.; and U.S. Pat. No. 4,243,866 to Pfeiffer et al.; all of which are incorporated herein by reference in their entireties. The modulated electron beam is moved and flashed across the substrate using a scanning system, such as for example, raster, vector, or hybrid raster-vector scanning. The beam and substrate are moved relative to one another so that the beam traverses across the substrate in linear strip-wise motion (e.g. raster beam scanning), in vector-based steps (vector scanning), or in a combination of vector and raster scanning. For example, in one raster scan method, called raster Gaussian beam scanning (RGB), A preferred writing method, commonly known as shaped beam writing, a variable shaped beam is moved directly to locations above a substrate specified by vector coordinates that can be independently derived or localized along a raster scan, and flashed once over those locations. In this technique, the circuit design pattern is divided into a series of geometric primitives which are then refined to rectangles, parallelogram, and triangle flash shapes associated with location coordinates. The electron beam is then moved directly to the location coordinates that fall within a raster scan and flashed to expose the location site with the desired shaped electron beam flash. The beam is shaped for each flash using beam shaping beam shapers, which have apertures with dimensions of typically larger than 1 µm. The shaped beam provides flash profiles having sharper edges than the Gaussian curve edges of Gaussian beams, providing higher resolution and better critical dimension uniformity. Also, the beam traverses directly to the area to be written skipping unexposed areas to reduce total exposure time by a percentage corresponding to that of unwritten/written area. It is desirable to have higher resolution coupled with faster writing speeds to write circuit design patterns having features with increasingly small dimensions.

In the shaped electron beam column, the electron beam is generated from an electron source, which provides a stream of electrons. Conventional shaped beam columns often use thermionic electron sources typically comprising lanthanum hexaboride ($LaB_6$), an exemplary version being shown in FIG. 1A. The thermionic source 10 comprises a rounded tip 12, which is heated to a temperature at which the electrons have sufficient energy to overcome the work function barrier of the $LaB_6$ conductor to escape from the tip. The emitted electrons are accelerated by a Wehnelt anode 11, which is typically, and distance of several millimeters. The rounded tip 12 has, for example, a relatively large radius of approximately 5 µm, and produces a large and uniform electron distribution 14 with adequate brightness to illuminate the apertures used to shape the beam. The large illumination area also allows the apertures to selectively pass through only the central region of the beam to provide a more uniform electron density and exclude Gaussian curved edges. However, while the thermionic source 10 works well for conventional shaped electron beam writing, they are optimal for writing ever smaller features which now are smaller than 90 nm in dimensions.

Thermal field emission (TFE) electron sources 15 are typically not used for shaped beam electron columns. An exemplary version of a TFE electron source 15, as shown in FIG. 1B, comprises a narrow needle tip 16 of tungsten, which typically has a radius of approximately 0.3 to 1 µm (about $\frac{1}{10}$ the size of the radius of the thermionic source 10). The needle tip 16 is heated to temperatures of about 1800 K, while an electric field is applied using a suppressor 20 and an extractor 22 spaced apart distance of several hundred microns (as opposed to millimeters with the thermionic source) that is sufficiently strong to cause electrons to tunnel through the barrier and be emitted as a narrow beam 18. The tungsten tip 16 is usually coated with a layer of zirconium oxide to reduce the work function barrier, and a heated reservoir of zirconium oxide (not shown) continuously replenishes material evaporated from the tip 16. The TFE source 16 features a higher brightness and associated depth of field than the thermionic sources, a small virtual source size, and a moderate energy spread, making is more desirable to achieve the higher beam currents which are needed for efficiently writing the ever smaller features. The small angular intensity of the TFE source 16 means that a relatively large angle of emission must be accepted from the gun to capture a certain total current. Unless large (>100 µm) shape apertures 126 are used, this large angle must be reduced by a large magnification M in the upper column. The combination of the large gun angle and large M increase the effect of spherical aberration on illumination uniformity at the upper shape.

Thermionic sources 10 have been used to generate shaped electron beams using Köhler illumination mode optics, as for example disclosed in Komagata et al., SPIE 2096 (1997) pp 125-136, which is incorporated herein by reference in its entirety. It is desirable to be able to use TFE sources 16 with Köhler illumination because the TFE sources 16 provide higher illumination brightness allowing for the possibility of higher beam currents in small shaped beams. However, the narrow electron beam 18 from the TFE source 16 has to be magnified to be significantly larger than the beam shaping apertures to be used with Köhler illumination mode optics. Conventional electrostatically focused particle gun which use TFE sources 16 have a large spherical aberration coefficient, and upon magnification, the spherical aberration would grow as the product of the coefficient times the third power of the illumination angle times the magnification. Thus, the use of TFE sources 16 with critical or Köhler illumination of a beam shaping aperture in a conventional optics would lead to excessively large spherical aberration due to the magnification required. Aforementioned U.S. Pat. No. 6,262,429 to Rishton describes shadow projection shaped-beam optics in order to avoid magnifying a small TFE source; however, shadow projection optics have undesirable properties including lack of focus of the beam spot onto the image plane. Thus, it is desirable to have a shaped electron beam column capable of using a TFE electron source 16 in combination with Köhler illumination optics.

In shaped electron beam columns, the electron beam image to be projected onto the substrate is created by deflecting the image of an upper aperture onto lower apertures having different shapes to create a composite image having the desired beam shape. The beam shaping module performs the functions of illuminating the apertures, selecting a beam current, imaging the upper aperture on the lower aperture, projecting a demagnified image of the apertures into the substrate plane, and selecting a suitable beam aperture in the substrate plane. In conventional electron beam systems, these parameters are coupled. For example, the condition of imaging the first aperture upon the second aperture, and having a fixed location of the crossover between both apertures (which defines the illumination angle of the apertures) fixes beam current and final aperture angle. However, it is often desirable to be able to select different electron beam paths to adapt to different illumination requirements in the substrate plane to compensate for changes in beam illumination characteristics and associated changes in beam crossover points.

Another problem with conventional shaped beam columns arises because the excitation of the focus lens in the column has to be changed dynamically while a focused charged electron beam is deflected over large angles across the substrate because the distance from the deflection pivot point to the flat object changes with the angle. For raster or vector scanning systems, the beam deflection speed usually is so high that the main objective lens, which is generally magnetic, cannot be adapted fast enough due to its high inductivity and the creation of eddy currents. Thus, additional small magnetic coils are inserted into the objective lens for better dynamic focus control. However, the upper frequency of these small magnetic coils is also limited by eddy currents and inductivity, unless they are isolated magnetically and electrically from their surroundings, for example by ferrite shields.

Another dynamic focusing solution involves use of an electrostatic focusing lens, as for example described in T. Hosokawa et al, JVST B1(4), 1983, P1293ff, which is also incorporated herein by reference in its entirety. Electrostatic lenses generally have even better high frequency behavior than small magnetic coils. However, electrostatic focusing lenses general consist of three round concentric electrodes, which add space requirements and thereby increase total column length. As the column length increases, the electron beam is subject to increased beam broadening effects due to electron-electron interactions and sensitivity to noise, which in turn reduces pattern-writing resolution. Thus, it is desirable to have a more compact electrostatic focusing lens system, which can rapidly deflect the electron beam while reducing electron beam column length.

Thus it is desirable to have a pattern generation system capable of using a field emission source to write patterns with a shaped beam writing method. It is further desirable to be able to use field emission sources to produce a large wide area beam for illuminating apertures without excessive spherical aberration or magnification problems. It is also desirable to use the field emission source with Köhler illumination of a beam-shaping aperture. It is also desirable to have a more compact electrostatic focusing lens system, which can rapidly deflect the electron beam while reducing electron beam column length to maintain beam spot resolution.

SUMMARY

A multifunction module for an electron beam column comprises upper and lower electrodes comprising multipoles, the upper and lower electrodes capable of receiving voltages for deflecting, or aberration correction of, an electron beam passing through the electrodes. A central ring electrode to which a voltage can be applied independently of the voltages applied to the upper and lower electrodes is used to focus the electron beam on a substrate.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIGS. 3A and 3B are schematic diagrams of upper and lower beam shapers that can be used to shape an electron beam into rectangles and right isosceles triangles using a deflector;

FIG. 3C is a schematic diagram showing the different flash shapes that can be obtained from the apertures of FIGS. 3A and 3B, and also showing the edges of the lower aperture superimposed on the flash shapes;

DESCRIPTION

Figure 1A:
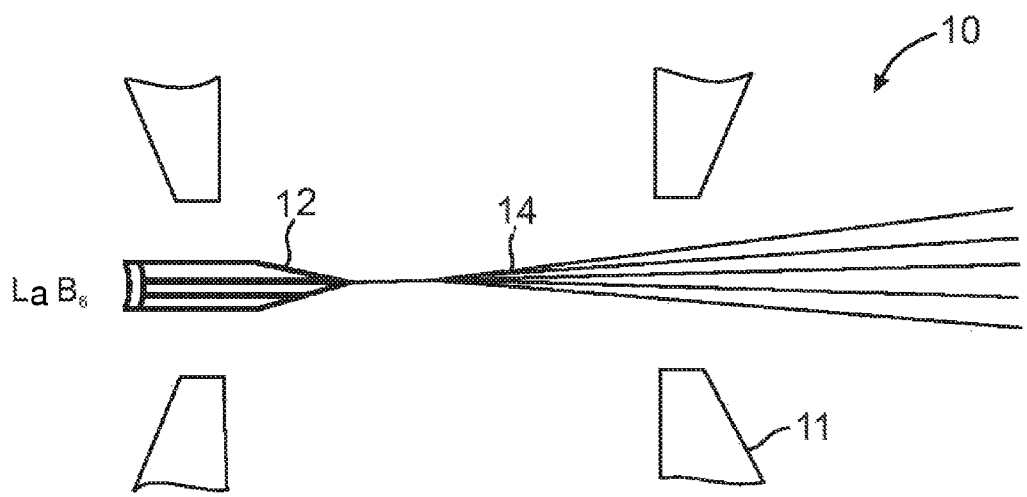
FIG. 1A (Prior Art) is a schematic diagram of a thermionic electron sources comprising lanthanum hexaboride ($LaB_6$)
Figure 1B:
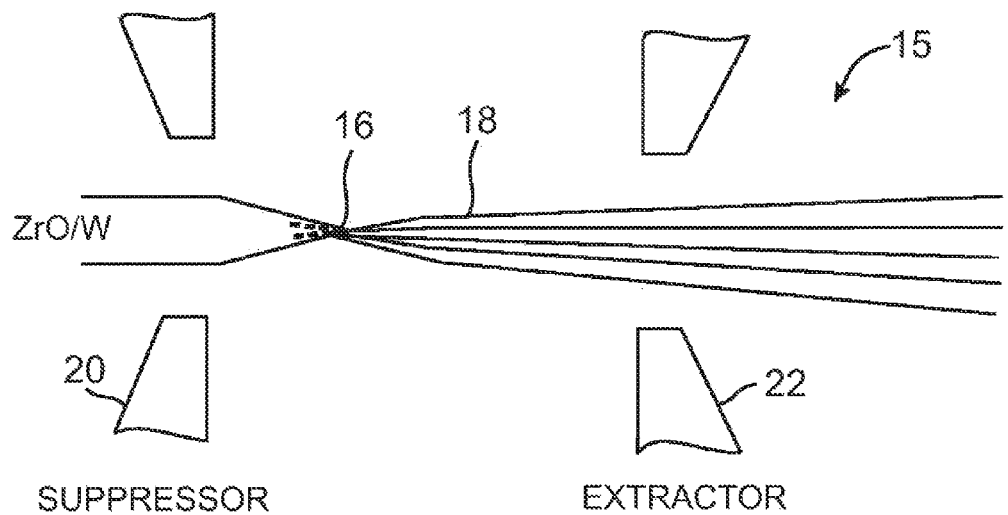
FIG. 1B (Prior Art) is a schematic diagram of a thermal field emission electron source comprising a tungsten tip supplied with $ZrO_2$.
Figure 2:
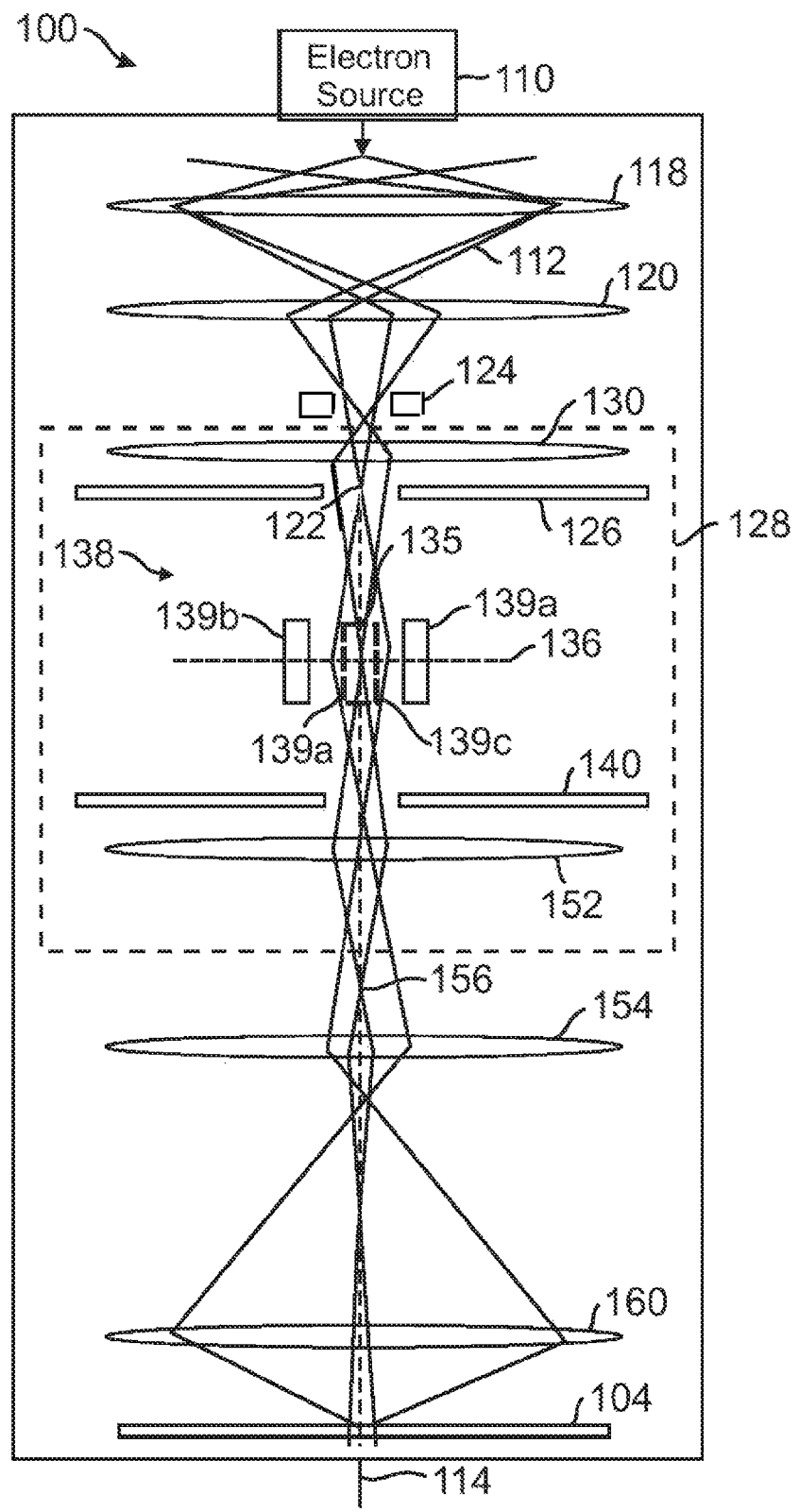
FIG. 2 is a schematic diagram of an exemplary electron beam column.

An exemplary version of an electron beam column 100 for generating, shaping, and writing an electron beam across a substrate 104 is illustrated in FIG. 2. The electron beam column 100 comprises a housing 106 comprising an electron source 110 to generate electrons which are formed into an electron beam 112 that drifts along an axis 114 toward the substrate 104 in a column maintained at a vacuum in the range of $10^{-7}$ to $10^{-9}$ Torr. In one version, the electron source 110 is a thermal field emission electron source (TFE) 15, as shown in FIG. 1B, comprising zirconiated tungsten, that is a tungsten tip 16 coated with $ZrO_2$ or $ZrH_2$, and heated to a temperature of about 1800 K while an electric field is applied across the source 15. A suitable TFE source 15 provides a current per unit solid angle, $dI/d\Omega$, otherwise known as angular intensity, of at least 1 mA/steradian. Thermal field emission sources are available from Denki Kagaku Kogyo, Japan or FEI Co., Hillsboro, Oreg. A suitable TFE source 15 is, for example, described in U.S. Pat. No. 6,798,126 to Schwind et al., assigned to FEI Co., Hillsboro, Oreg., which is incorporated herein by reference in its entirety. While a TFE source is preferred, it should be noted that other electron sources can also be used in versions of the column 100, for example, thermionic sources such as lanthanum hexaboride; thus, the scope of the present invention should not be limited to thermal field emission sources.

The electron beam 112 emitted from the electron source 110 is passed through electron optics including various condensers, projection, magnification, demagnification, objective and other lenses, along its drift path through the column 100 until it reaches the substrate 104. The electron optics can include electromagnetic or electrostatic lenses, of which electromagnetic lenses are generally preferred. In the version of the electron beam column shown, initially, the electron beam 112 passes through a pair of condenser lenses 118, 120 which are electromagnetic lenses comprising coils within iron shrouds with the gaps between the shrouds serving as the openings through which the electron beam 112 is passed. The upper condenser lens 118 focuses an image of the electron source 110 prior to the plane of the lower condenser lens 120, which in turn, focuses the electron beam 112 at a crossover point 122 which lies in the plane of a blanker 124. The blanker 124 blanks or turns the beam on and off, using a pair of electrostatic deflector plates as described below for a deflector, which are connected to a conventional blanking amplifier with a fast response time. To turn the electron beam off, a voltage is applied across the blanking deflector plates sweeps the beam 112 off axis until it is intercepted by the solid portion of the upper beam shaper 126, which is downstream of the deflecting plates.

A beam-shaping module 128 is used to shape the electron beam 112. The beam-shaping module 128 comprises an upper projection lens 130, which has a focal length set to focus the electron beam at a point along the axis 114, which is at the center 135 of a deflector plane 136 of a deflector 138. Before the beam 112 reaches the first deflector 138, it is projected onto the upper beam shaper 126, which shapes the electron beam 112 to have a rectangular cross-section. An upper aperture 134 formed in upper beam shaper 126 allows the central portion of the beam 112 to pass through while the edges of the beam are blocked by the plate 126 allowing only the aperture shaped beam to emerge from the shaper 126. FIG. 3A shows a version of the upper beam shaper 126 comprising an upper aperture 134, which is rectangular, more specifically square, to form a square electron beam.

Figure 4:
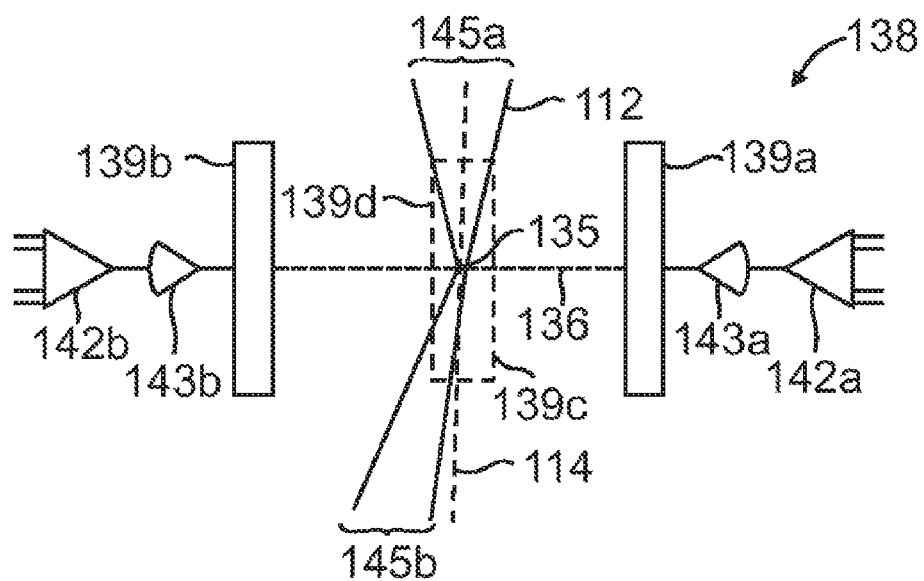
FIG. 4 is a schematic diagram of an exemplary embodiment of an electron beam deflector.

A deflector 138 is used to deflect the square shaped electron beam 112 to image the beam onto different positions on a lower beam shaper 140 to form different electron flash shapes. The deflector 138 also serves as a transfer lens. Referring to FIG. 4, the deflector 138 comprises four electrostatic plates with two plates 139a,b in the plane of the paper and two plates 139c,d perpendicular to the plane as shown by the dotted lines, the plates 139a,b,c,d being spaced apart from each other across an electron beam gap. Each pair of plates 139a,b and 139c,d serve to deflect the electron beam 112 laterally along two orthogonal directions when complementary voltages are applied to the pairs of plates. In operation, the voltage differential between a pair of electrostatic plates 139a,b and 139c,d provides a push-pull circuit, and is generated by applying bit codes to one or more DACs 142a,b which convert the bit codes to complementary analog voltage signals which are then amplified by amplifiers 143a,b, respectively, and applied to the deflector plates 139a,b. The voltage level and relative polarity of the signal applied to the plates determine the extent of deflection of the electron beam 112, for example, from initial position 145a which is centered on the axis 114 to final position 145b which is off-centered from the axis 114. Additional deflectors can also be positioned downstream from the deflector 138 to further refine deflection accuracy. As suitable deflector system is described in for example, U.S. Patent Application Publication No.: 2007/0075887 A1, application Ser. No. 11/242,976, entitled "Electrostatic Particle Beam Deflector" to Stovall et al., filed on Oct. 3, 2005, which is incorporated by reference herein in its entirety.

The lower beam shaper 140 typically contains a number of different lower apertures, including for example, a lower square aperture 144 surrounded by four right triangle apertures 148a-d, as shown in FIG. 3B. The upper and lower beam shapers 126, 140 form electron beam flash shapes by projecting the image of the upper aperture 134 in the right location over the apertures 144 or 148a-d of the lower beam shaper 140. For example, a rectangle flash shape with sides parallel to the XN axes can be formed by projecting the square beam 112 against one of the corners of the lower square aperture 144 so that two adjacent edges are formed by the lower aperture. FIG. 3C shows the 8 flash shapes produced from the upper and lower beam shapers 126, 140 apertures 134 which include four different types of rectangles 1-4 that can be formed with the four corners, and right-angle triangles 5-8 which have their non-hypotenuse sides parallel to the XN axes and their hypotenuse formed by the lower aperture. The heavy lines show the edges of these shapes, formed by the apertures 144, 148a-d of the lower beam shaper 140. The circular dots are reference points, which represent locations that are fixed relative to the center of the lower beam shaper 140. While two configurations of the upper and lower beam shapers 126, 140 are shown, other configurations are also possible as would be apparent to those of ordinary skill in the art, for example, the upper beam shaper 126 may have a rectangular aperture and the lower beam shaper 140 may also have an aperture that is rectangular or having other shapes.

The flash areas of the rectangular and triangular tiles are constrained by the parameters of the electron beam column 100, for example, a maximum singular dimension of a tile should be less than $3/2\lambda$ and the minimum dimension at least about $\frac{1}{2}\lambda$, where $\lambda$ is a fixed length for the electron beam column 100 which is related to the maximum flash area and the separation between raster locations. For an electron beam column 100 having a maximum flash area of 192 nm and a separation distance between raster locations in the X-direction of about 1024 nm, the value of $\lambda$ is about 128 nm. In FIG.

3B, each arrow represents a length of 1.5λ'D, where λ' is defined as a number slightly greater than λ, for example, greater than λ by about 10%, and where D is the demagnification of the lower column optics.

The beam shaping module 128 is completed with a lower projection lens 152 which has a focal length selected to focus the shaped beam image into a crossover point 156 corresponding to the entrance pupil of the demagnification lens 154 so that the shape beam image is centered about the axis 114 irrespective of deflection to utilize primarily only the central portion of the demagnification lens. This reduces degradation of beam spot edge resolution, which would otherwise result if the image were projected off-centered upon the demagnification lens. The shaped beam image is demagnified through the demagnification lens 154 to form a magnified image in a plane centered about the axis 114 before an objective lens 160. Thereafter, the objective lens 160 defines a semi-angle of convergence to form a beam spot on the target substrate 104 which has a uniform beam current density. For a given aperture sizes, the objective lens 160 determines the final beam convergence angle and consequently the required brightness.

In the column 100, the beam shaping module 128 comprises the upper projection lens 130, the upper beam shaper 126 having upper aperture 134, the deflector 138, the lower beam shaper 140 having the square aperture 144 and right triangle apertures 148a-d, and the lower projection lens 152. Advantageously, the beam-shaping module 128 allows adjustment of the beam shape illumination conditions independently of the path of the electron beam 112. This allows the magnitude of the beam current to be selected independently of the final angle of the electron beam, as it is incident on the substrate 104. In the beam-shaping module 128, the upper and lower beam shapers 126, 140, are located within the duplet of projection lenses 130, 152. This arrangement allows the excitation of the projection lenses 130, 152 to be changed to keep the location of the electron beam crossover 135 in the deflector plane 136 constant even if the illumination conditions change, for example, the location of the electron beam crossover point 122 before the upper projection lens 130 or the crossover point 156 after the lower projection lens 152. Thus, advantageously, the beam shaping module 128 operates as a single lens with the object and image lengths defined by the upper projection lenses 130, 152, respectively, to provide a significant improvement over prior art beam shaping systems.

Figure 5A:
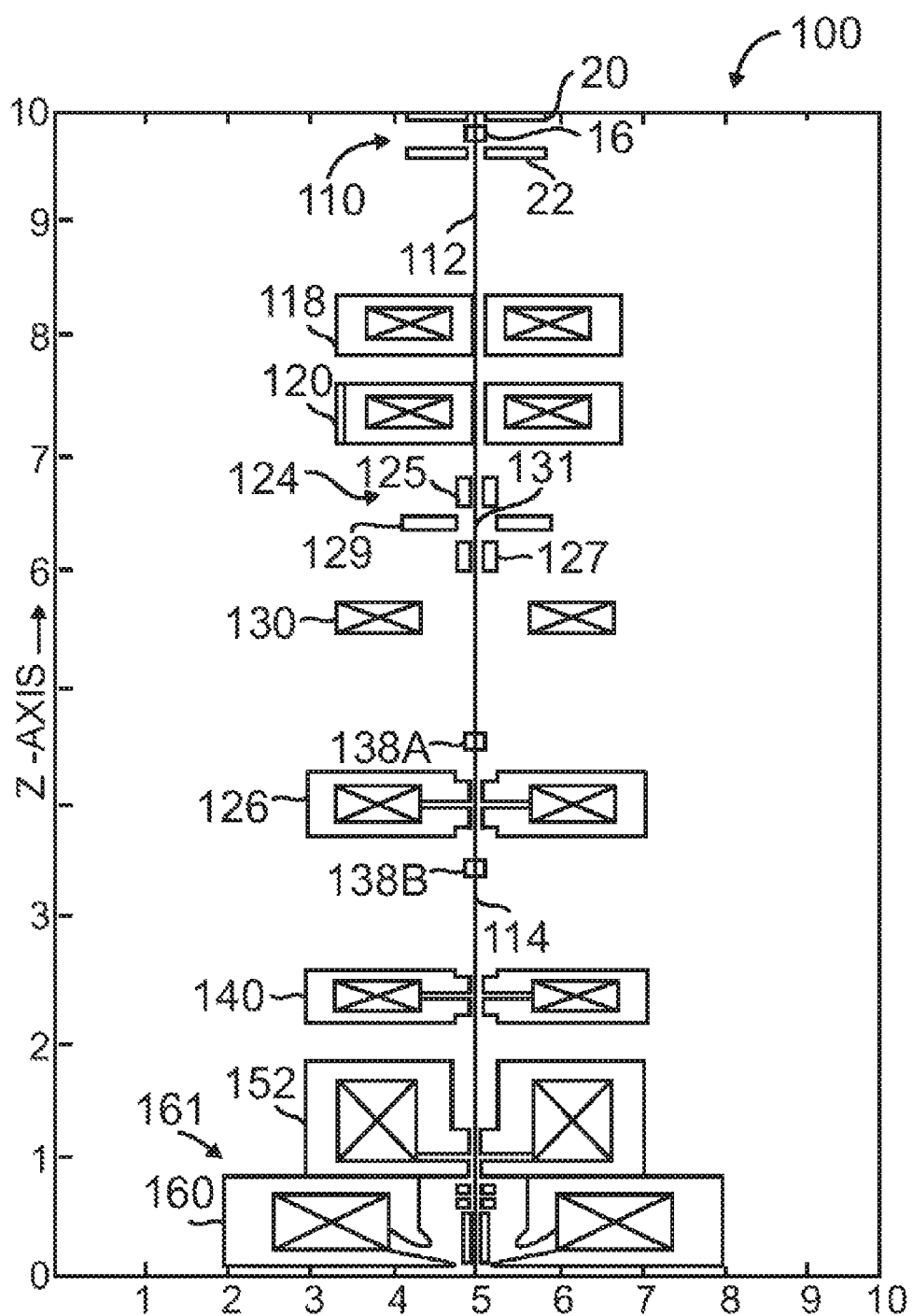
FIG. 5A is a schematic diagram of another exemplary version of an electron beam column comprising a TFE electron source and Köhler illumination mode optics.
Figure 5B:
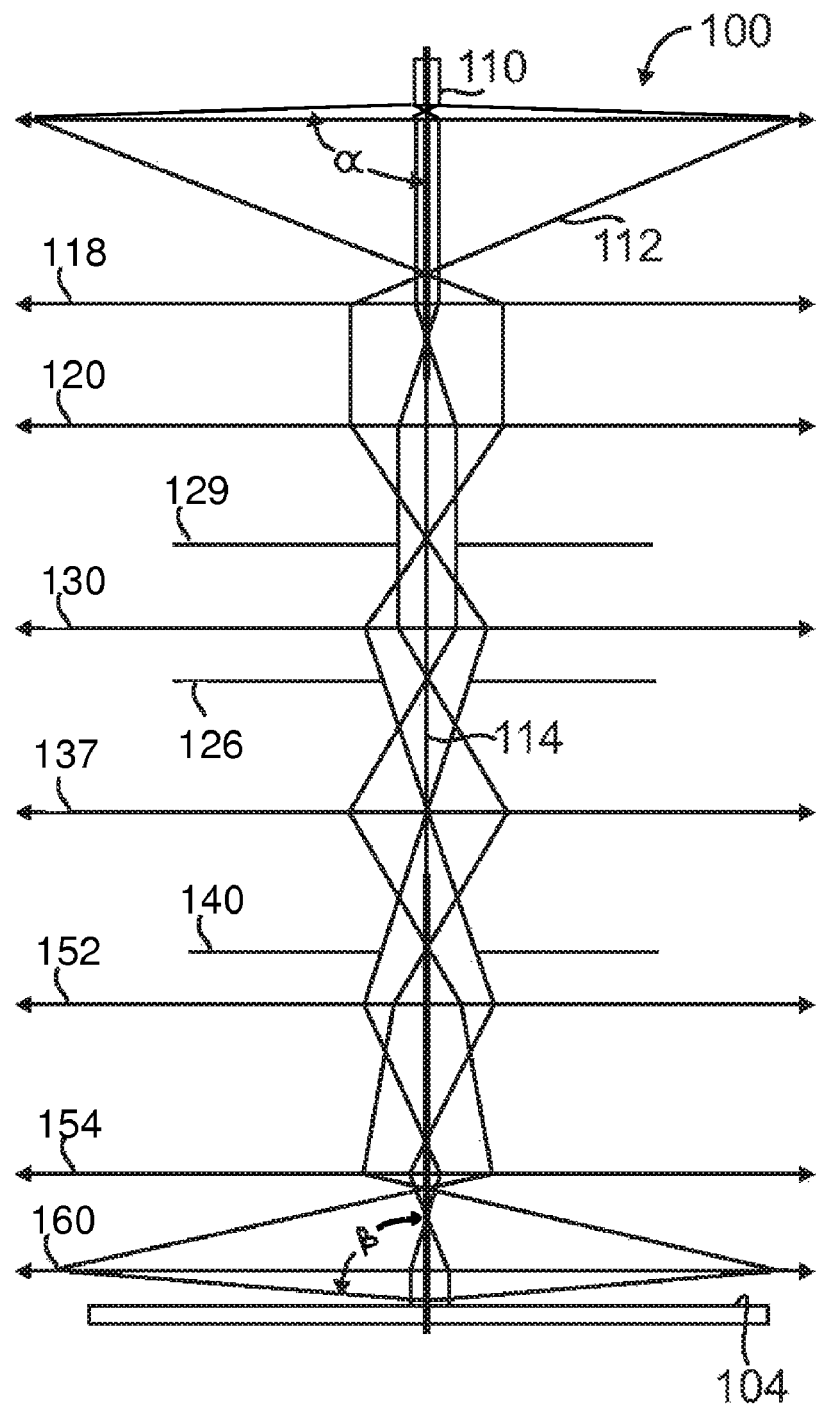
FIG. 5B is a schematic diagram of the electron beam column of FIG. 5A showing the ray paths of the electron beam.

The electron optics of the electron beam column 100 can also be configured in Köhler beam illumination mode to process the electron beam 112 from a TFE source 16, as for example, illustrated schematically in FIGS. 5A and 5B. The TFE source 16 is typically small with a radius of between 0.3 micron and 1 micron, and electron emission from such sources is only uniform over a limited emission angle. The TFE source 16 also comprises a suppressor 20 and an extractor 22 which are maintained in an electric potential difference to define the electron beam 112. FIG. 5A shows an exemplary layout of the components of the electron beam column 100 and FIG. 5B shows the same optics in schematic form along with the ray paths from source 100 to substrate 104 at the origin of the Z-axis. The electron source 110 is separated from the substrate 104 by distance of from about 300 to about 1200 mm, or even from about 400 to about 800 mm, and in the exemplary embodiment about 750 mm.

Köhler illumination mode optics are desirable because the size of the imaged electron beam shape does not change with small changes of focus. Equivalently, vertical displacement of the substrate 104 also does not change the imaged shape size. In electron beam lithography, precise control of the critical dimensions of the features being written on the substrate 104 is particularly important when the feature sizes become ever smaller, on the order of 50 to 100 nm, or even less than 50 nm. Any substantial deviation in features size renders the substrate unusable as a lithography mask. Advantageously, in the electron beam column 100, application of Köhler mode optics allows the size of the imaged electron beam to be substantially independent of small changes in beam focus or vertical displacement of the substrate 104, providing more accurate control of the critical dimensions of features written on the substrate 104.

Referring to FIG. 5A, the electron beam column 100 comprises an electron source 110 which generates an electron beam 112 having a semi-angle of illumination α, that is passed through a pair of upper and lower condenser lenses 118, 120. The blanker 124 blanks or turns the beam 112 on and off, using an upper and lower blanking deflectors 125, 127 that each comprise a pair of facing electrostatic deflector plates and a blanking plate 129 with a blanking aperture 131. To turn the electron beam off, a voltage is applied by one or more blanking amplifiers across the deflector plates of the upper and lower blanking deflectors 125, 127 sweeps the beam 112 off axis from the blanking aperture 131 until it is intercepted by the solid portion of the blanking plate 129.

Thereafter, the beam 112 passes through a projection lens 130 which focuses the electron beam 112 at the center of a shaping deflector 138, which is implemented as an upper shaping deflector 138a, a lower shaping deflector 138b, and a transfer lens 137. The shaping deflector 138 is used to deflect the square shaped electron beam 112 to image the beam onto different positions on a lower beam shaper 140. A lower projection lens 152 is downstream of the lower beam shaper to form different electron flash shapes, and is followed by a demagnification lens 154 and an objective lens 160. These lenses project an electron beam having a semi-angle of convergence p, which has a uniform beam current density. The electron beam column 100 further comprises a multifunction module 161, which provides a combination of focusing, deflection and aberration correction. The multifunction module 161 serves as an objective lens of the column 100, and also contains a microvector deflector 162 and a mainscan deflector 164 both of which are used to deflect the electron beam 112 across the substrate during writing. While a multifunction module 161 is shown, it should be understood that the module 161 can be replaced by conventional objective lenses and beam deflector systems, as would be apparent to those of ordinary sill in the art; thus, the scope of the present claims should not be limited to the exemplary embodiments described herein.

Referring to FIG. 5B, the Köhler optics transforms an electron beam having a source ray cone 161 with a semi-angle of illumination α to form an image-forming ray cone 161 having a semi-angle of acceptance β. The semi-angles α and β are directly proportional. The electron beam 112 converges to form an image of the source in the back focal plane of the objective lens 160, which results in invariance of the shaped beam size vs. focus near the image plane. It can be shown that:

$$\beta_{final} = (d_{source}/shape_{final})\alpha_{source}$$

Thus, the acceptance semi-angle β is the angle defined by the ratio of the source size, that is diameter, $d_{source}$, and the final size of the shaped beam, $shape_{final}$, multiplied by the source semi-angle α. The acceptance semi-angle β is half the angle subtended by the electron beam at the writing plane, that is, at the top surface of the substrate 104.

The spherical aberration of the illumination at the aperture plane is given by $C_s\alpha^3 M$, where M is the magnification from the electron source 110 to the imaged at or below the aperture plane, $C_s$ is the spherical aberration coefficients and $\alpha$ is the semi-angle of illumination ray cone. The proportionality is enforced because we want the shape aperture to lie in a plane nearly conjugate to the source. This positions a magnified image of the source below the shape aperture. Furthermore, the size of this source image sets the acceptance angle β at the final image plane of the following optics.

For a conventional electron column system, the following optical values are typical:

TABLE I

| Optical Parameters | Conventional Column | Present Electron Beam Column 100 |
|---|---|---|
| α | 1 mrad | 3 mrad (set by current reqd.) |
| β | 3-5 mrad | ¼-3 mrad (1.5) |
| M | ⅓-3 | 15-60 (30) |
| D | 20 | 32-128 (64) |
| Aperture size | 80 μm | 3-20 (8) μm |
| Final shape | 4 μm | 1/32-1 (⅛) μm |
| Source size | 1 μm | 10-100 (25) nm |

The relatively large value of spherical aberration produced by conventional optics results in substantial illumination non-uniformity at the shape plane.

In one version of the present electron beam column 100, the spherical aberration problem is solved by reducing the semi-angle of acceptance □ from about ¼ to about 3 mrad, or even from about 1 to about 3 mrads, and in one example about 1.5 mrad; as compared to conventional optical designs in which the acceptance semi-angle □ ranges from about 3 to about 5 mrad. This is accomplished by choosing the final shape size and illumination semi-angle, since the source size is fixed for a particular TFE source. As shown in Table I, in one version, the parameters of the electron optics column 100 are also set to also provide a magnification of from about 15 to about 60, a demagnification of from about 32 to about 128, an aperture size of from about 3 to about 20 μm, a final beam shape of from about 1/32 to about 1 μm, and a size of the TFE source that is from about 10 to about 100 nm.

However, conventional understanding predicts that as the semi-angle of acceptance □ decreases, the interelectron repulsion-induced beam blur will increase which is undesirable. For example, Komagata 1997, pg. 126, reports that an electron beam column which is shorter in length and which has a wider semi-angle of acceptance □ reduces the Coulomb interaction at high beam currents; conversely, decreasing the semi-angle of acceptance □ would be expected to increase Coulomb interaction at high beam currents. For a conventional imaged, shaped beam particle optics illuminated by a thermionic source providing an electron beam with a Gaussian distribution, this is an experimentally validated statement as for example described by Jansen, J. Vac. Sci. Tech. B6(6) (1988) pp 1977-88, which is incorporated herein by reference in its entirety.

Figure 6:
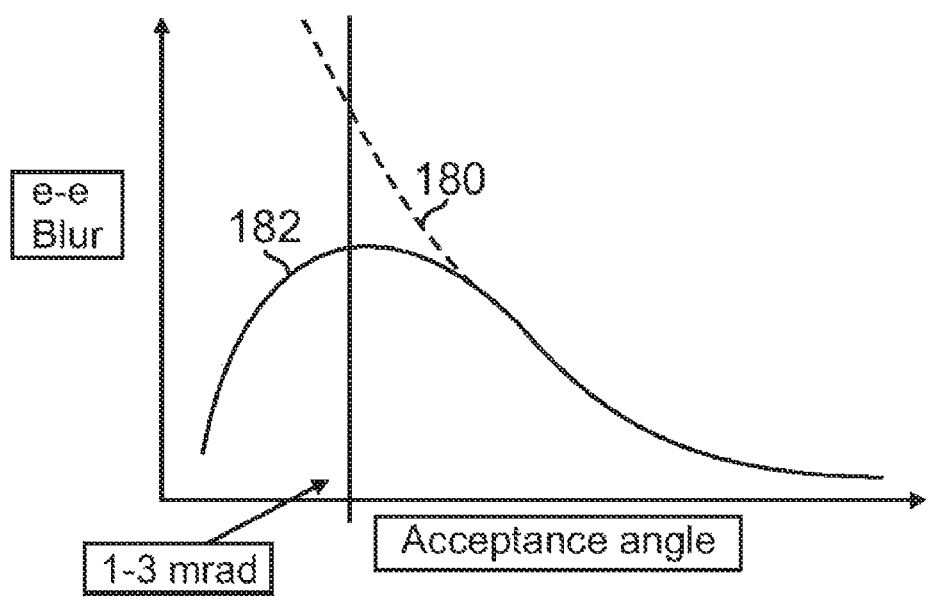
FIG. 6 is a graph showing the relative intensity of electron to electron beam blur as a function of the acceptance semi-angle $\beta$.

However, unexpectedly and surprisingly it has been determined that reducing the semi-angle of acceptance □ does not increase, but instead actually reduces, electron beam blur effects. FIG. 6 shows the expected relationship, shown by dashed line 180, of decreasing electronic electron beam blur with increasing acceptance angle. However, it was determined, as shown by the solid line 182, that the electron to electron beam blur after initially rising from an acceptance semi-angle to less than 1 mrad, unexpectedly, gradually decreases with increasing acceptance semi-angle α. It is believed that reducing the acceptance angle sufficiently moves one into the pencil beam regime. The TFE source 16 has sufficient brightness, typically about 1000 times as bright as a lanthanum hexaboride thermionic source, that sufficient current can be transferred into the electron beam even at small acceptance angle of the pencil beam regime. In contrast to the Gaussian beam regime produced by the thermonic source, the pencil beam regime produced by the TFE source 16 causes interelectron repulsion-induced blur to decrease with decreasing final acceptance semi-angle β as shown.

Reducing the acceptance semi-angle β has further advantages. Since most optical aberrations are functions of the acceptance angle to positive powers as well, such as for example, spherical, chromatic, and deflection aberrations, reducing the acceptance semi-angle β should provide significant improvement of beam definition by reducing spherical, chromatic, and deflection aberrations. In addition, the depth of focus also rapidly increases with reduced acceptance semi-angle β, which is also desirable.

Thus, the lower limits of the acceptance semi-angle β is governed by the unexpected decrease in electron to electron beam blur after reaching an acceptance semi-angle β of at least about 1 mrad. The upper limit of the acceptance semi-angle β is determined by the geometry and dimensional limitations of the electron beam column. For an electron beam column 100 having a total length of about 300 to 1200 mm, for example about 750 mm, it has been determined that the upper limit of the acceptance semi-angle β, should be less than about 3 mrad. Consequently, the optical parameters of the electron beam column 100, which includes the optical parameters of the electron beam optics comprising various lenses, as well as the other components of the column including the electron beam blanker and beam shaping module components, should be set to achieve a range of acceptance semi-angle β of from about 1 to about 3 mrads. The optical parameters are parameters such as the focal length of the lenses, aperture sizes, and distances between the different components of the column 100, which affect the travel direction, shape and size of the electron beam 112.

It is believed that the resolution in the electron beam column 100 can be further improved by lowering the spherical aberration coefficient of the electron optics of the entire column 100. As previously described, the spherical aberration is given by a coefficient times the acceptance angle to the third power times the magnification. Thus, reducing the acceptance semi-angle (as previously described) reduces the spherical aberration coefficient. Similarly, reducing the spherical aberration coefficient of the electron optics of the entire column 100 should also be reduced to further increase resolution of the electron beam image being patterned on the substrate 104. The spherical aberration coefficient of a lens depends on the lens design, for example, a magnetic gun lens provides a substantially better spherical aberration coefficient as compared to a conventional electrostatic lens. Electron optics that use magnetic gun lenses, is for example disclosed in U.S. patent application No. 60/715,973 filed on Sep. 10, 2005, which corresponds to U.S. patent application Ser. No. 11/286, 802, entitled "Electron beam source for use in electron gun", Steven T. Coyle et al., which is incorporated herein by reference in its entirety.

In yet another version, a TFE source 16 having a significantly increased virtual source size is selected. In this method, spherical aberration is reduced by reducing the magnification of the source 16 that would otherwise be required in the column 100. This can only be done if the source 16 is larger than conventionally found in TFE guns. The source of a thermal field emission source 15 can be enlarged by enlarging the size of the tip 16, which emits the electrons. A suitable tip size would be for example, at least about 1.2 micron, or even from about 1.2 to about 2 micron or higher. To use a TFE source having a large radius tip, the same aperture size and lower column demagnification can be maintained as for smaller tips, but the magnification between the gun and the crossover lying between the apertures should be decreased by a factor of at least about 2, or even at least about 3. This reduces the overall demagnification from around 50× to about 15× to 25×.

While three approaches are described, it should be noted that the three approaches can be used separately, or in any combination, in a single electron beam column 100 to maximize reduction of aberration problems while increasing electron beam resolution.

Referring back to FIG. 5A, the electron beam column 100 further comprises a multifunction module 161, which provides a combination of focusing, deflection and aberration correction functions. The multifunction module 161 serves both as an objective lens of the column 100 and as a microvector deflector 162 and mainscan deflector 164. Thus, the multifunction module 161 combines the function of an electrostatic focusing lens with electrostatic deflection and/or aberration correction multipoles.

Figure 7:
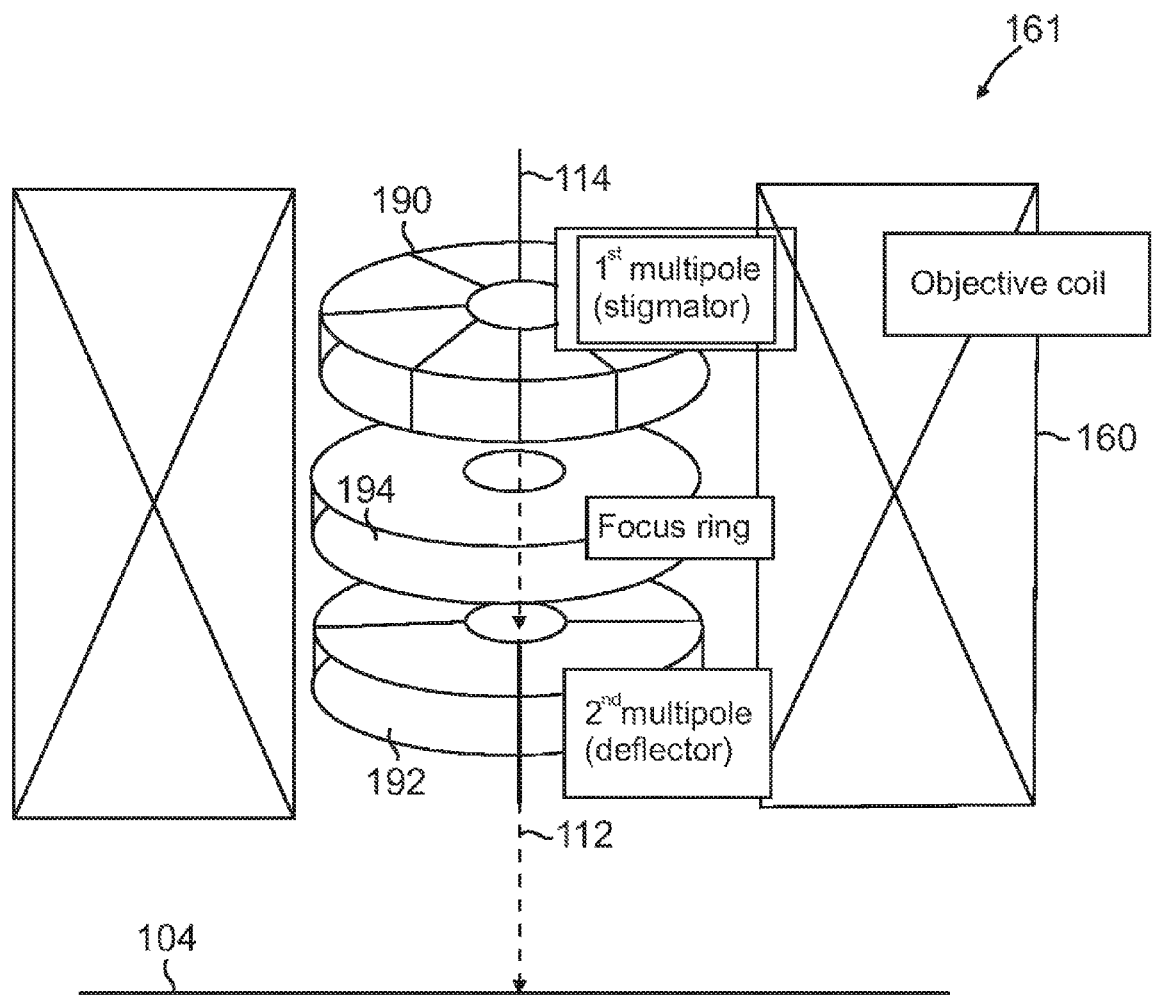
FIG. 7 is a schematic diagram of a multifunction module that provides electrostatic focusing, deflection and aberration.

An exemplary embodiment of a multifunction module 161 is shown in FIG. 7. The multifunction module 161 comprises a plurality of electrodes at least one of the exterior electrodes being used for deflection or aberration correction. In the example shown, the upper and lower electrodes 190, 192 of the three electrodes electrostatic focusing lens are multiples, which are used for either deflection or aberration correction. For example, the upper electrode 190 can be used for deflection, and can be for example, a quadrupole. The lower electrode 192 can be a stigmator used for stigmation of the electron beam 112, and can be for example, an octupole.

The middle electrode 194 is a central ring electrode to which a focusing voltage can be applied independently of the voltages applied to the upper and lower electrodes 190, 192. This reduces the complexity of the electronic driving circuitry for the three electrodes 190, 192 and 194. The central ring electrode 194 is used for applying a dynamic focusing voltage to the electron beam 112.

A further advantage is that the multifunction module 161 effectively reduces the total length of the electron beam 100 by integrating the objective lens function with multiple deflector functions. In one example, the multifunction module has an objective lens with a focal length of from about 6 to about 12 mm, for example, about 8 mm, as compared to prior art focal lengths of around 30 mm. The multifunction module 161 can also be used in retarding field optics, in which case, the upper electrode 190 is represented by the upper part of the beam column, which lies on a higher potential.

Figure 8:
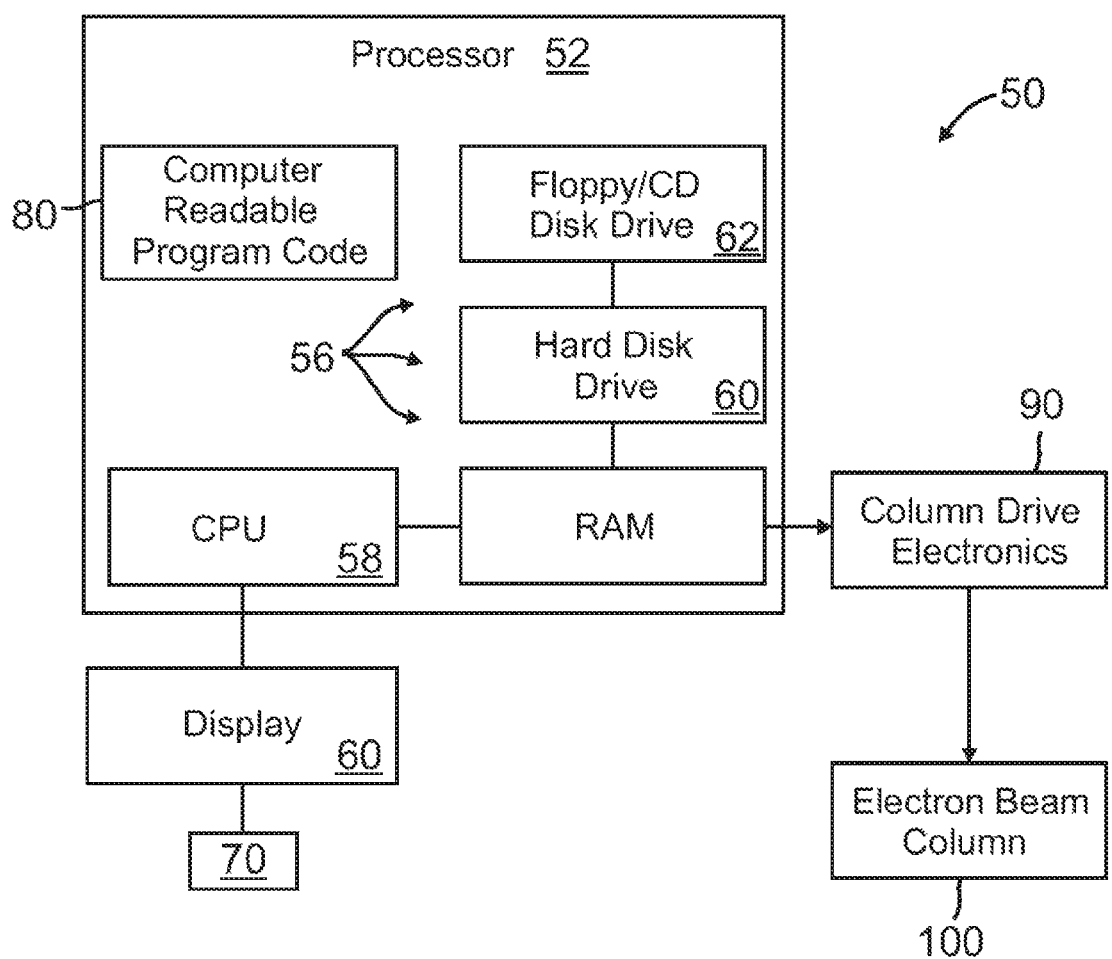
FIG. 8 is schematic block diagram of a processor capable of processing a circuit design pattern to generate flash data for an electron beam column.

A schematic of an exemplary embodiment of an electron beam apparatus 50 comprising the electron beam column 100 which can shape and modulate an electron beam to provide flashes to write a circuit design pattern onto a substrate is shown in FIG. 8. The apparatus 50 can provide a shaped electron beam that is, for example, an electron or ion beam that can be shaped to provide different geometric flash shapes. The apparatus 50 comprises a processor 52 to process circuit pattern data and column drive electronics 132 to control an electron beam column 100. The electron beam column 100 can provide a single beam or a set of electron beams, which are organized to provide a brush of beams. An exemplary electron beam apparatus capable of performing this writing strategy that uses electron beams is described in, for example, U.S. Patent Application Publication No.: 2007/0075275, U.S. patent application Ser. No. 11/243,304, entitled "Beam Exposure Writing Strategy System and Method" by Buller et al., filed on Oct. 3, 2005, which is incorporated herein by reference in its entirety.

In operation, a circuit design pattern to be written with the electron beam 112 onto a substrate 104 is generated and processed to form flashes as described in, for example, U.S. Patent Application Publication No.: 2007/0085032, U.S. patent application Ser. No. 11/243,299, entitled "Writing a Circuit Design Pattern with Shaped Electron Beam Flashes," to Buller et al., filed on Oct. 3, 2005, which is incorporated herein by reference in its entirety. To write the circuit design pattern onto a substrate, the processor 52 reads at least a portion of the circuit design pattern from the memory 56, the size of the read data dependent upon its buffer memory size, and processes the read data into flashes for writing. The processor 52 comprises electronic hardware and circuitry comprising integrated circuits suitable for processing data to send data signals to the column drive electronics 90, which in turn, have electronic components to operate the electron beam column 100 and its peripheral components. For example, the column drive electronics 90 can send signals to, and receive signals from, blankers, deflectors, and lens of the electron beam column 100 to flash an electron beam 112 in a selected order of shaped flashes while moving a 104 substrate to write a pattern on the substrate. While the processor 52 and column drive electronics 90 are described as separate units, they can also be combined into one unit, or broken into further units as would be apparent to one of ordinary skill in the art.

Generally, the processor 52 is adapted to receive and accept data, run algorithms, produce output data and signals, detect data signals from the detectors and other chamber components, and to monitor or control an electron beam apparatus. For example, the processor 52 may comprise a computer comprising (i) a central processing unit (CPU) 58, such as for example a conventional microprocessor from INTEL Corporation, (ii) a memory 56 that includes a non-removable storage medium 60, such as for example, a hard drive such as a RAID drive, ROM, RAM, and a removable storage medium 62, such as for example a CD or floppy drive; (iii) application specific integrated circuits (ASICs) that are designed and preprogrammed for particular tasks, such as retrieval of data, data processing, and operation of particular components of the electron beam apparatus; and (iv) various interface boards that are used in specific signal processing tasks, comprising, for example, analog and digital input and output boards, communication interface boards, and motor controller boards. The interface boards, may for example, process a signal from a process monitor and provide a data signal to the CPU. The computer also has support circuitry that include for example, co-processors, clock circuits, cache, power supplies and other well known components that are in communication with the CPU. RAM 66 can be used to store the software implementation of the present invention during process implementation. The instruction sets of code of the present invention are typically stored in storage mediums and recalled for temporary storage in RAM when being executed by the CPU. The user interface between an operator and the controller can be, for example, via a display 68 and a data input device 70, such as a keyboard or light pen. To select a particular screen or function, the operator enters the selection using the data input device and can reviews the selection on the display.

The processor 52 also comprises computer program code 80 that is readable by the computer and may be stored in the memory, for example on the non-removable storage medium or on the removable storage medium. The computer program code 80 comprises one or more software programs and/or sets of instructions of program code to transform the circuit design pattern to flashes, assign the flashes to scans, and operate the electron beam column 100 and its components to scan an electron beam across a substrate 104. The computer program code 80 may be written in any conventional programming language, such as for example, assembly language, C++, Pascal, or Fortran. Suitable program code is entered into a single file, or multiple files, using a conventional text editor and stored or embodied in computer-usable medium of the memory. If the entered code text is in a high level language, the code is compiled, and the resultant compiler code is then linked with an object code of pre-compiled library routines. To execute the linked, compiled object code, the user invokes the object code, causing the CPU to read and execute the code to perform the tasks identified in the program.

The flash data generated by the processor 52, which includes flash shape and size constraints, is processed for writing on the substrate by a suitable writing method. The processor 52 arranges the flashes in a selected order constrained by the type of scanning system used, for example, raster, vector or hybrid raster-vector scanning. In raster microvector (RMV) shaped beam scanning, an electron beam with a controlled flash shape is flashed at different locations across a substrate by a vector minor field scan superimposed on a raster major field scan. In this method, each vector field is assigned at most one flash and the vector flash fields are overlapped along raster scans which are offset by set distances to locally average over variations in pattern density. After assigning the flashes in a selected order corresponding to raster scan locations, a dose is assigned to each flash. The flash dose is the dwell time that the electron beam is maintained turned on over a vector-determined location along a raster major field scan. Thus, the final flash data includes flash shape, location and dose.

During scanning, the electron beam 112 is modulated by blanking the beam while moving a substrate 104 upon which the electron beam is incident. Scanning is performed by writing a series of passes, with each pass consisting of a series of Y-oriented scans. A multiphase writing strategy is typically used with the choice of 4-phase or 2-phase scans. In 4-phase writing, successive passes are stepped up in the Y-axis direction by roughly ¼ of the scan length for that each area is exposed to a total of four times. In 2-phase writing, successive passes are stepped up in the Y-axis direction by roughly ½ of the scan length so that each area is exposed twice. This provides good resolution of the pattern to be written on the substrate 104.

Although the present invention has been described in considerable detail with regard to certain preferred versions thereof, other versions are possible. For example, beam-shaping module can have other features or other component lenses. Similarly, alternative electron sources to the TFE source can also be used. Thus, the appended claims should not be limited to the description of the preferred versions contained herein.

What is claimed is:

1. A multifunction module for an electron beam column, the multifunction module comprising:
    (a) upper and lower electrodes comprising multipoles, the upper and lower electrodes capable of deflecting, or correcting aberration of, an electron beam passing through the electrodes; and
    (b) a central ring electrode to which a voltage can be applied independently of the voltages applied to the upper and lower electrodes to focus the electron beam on a substrate.

2. A module according to claim 1 wherein the upper and lower electrodes are capable of both deflecting and correcting aberration of the electron beam.

3. A module according to claim 1 wherein the upper, lower and central electrodes form an electrostatic focusing lens that provides electrostatic deflection and aberration correction.

4. A module according to claim 1 wherein the upper electrode comprises a quadrupole, and wherein the upper electrode is provided with a voltage sufficient to deflect the electron beam.

5. A module according to claim 1 wherein the lower electrode comprises a stigmator, and wherein the lower electrode is provided with a voltage sufficient to cause stigmation of the electron beam.

6. A module according to claim 5 wherein the stigmator is an octupole.

7. A module according to claim 1 comprising an objective lens having a focal length of from about 6 to about 12 mm.

8. A multifunction module for an electron beam column, the multifunction module comprising:
    (a) an electrostatic focusing lens comprising upper and lower electrodes that each comprise multipoles, the upper and lower electrodes capable of deflecting, and correcting aberration of, an electron beam passing through the electrodes; and
    (b) a central ring electrode to which a voltage can be applied independently of the voltages applied to the upper and lower electrodes to focus the electron beam on a substrate.

9. A module according to claim 8 wherein the upper electrode comprises a quadrupole, and wherein the upper electrode is provided with a voltage sufficient to deflect the electron beam.

10. A module according to claim 9 wherein the lower electrode comprises a stigmator, and wherein the lower electrode is provided with a voltage sufficient to cause stigmation of the electron beam.

11. A module according to claim 10 wherein the stigmator is an octupole.

12. A module according to claim 8 comprising an objective lens having a focal length of from about 6 to about 12 mm.

* * * * *